United States Patent [19]

MacRae et al.

[11] 3,895,965

[45] July 22, 1975

[54] METHOD OF FORMING BURIED LAYERS BY ION IMPLANTATION

[75] Inventors: Alfred Urquhart MacRae, Berkeley Heights, N.J.; Paul Miller, Allentown, Pa.; Robert Alan Moline, Gillette; John Simpson, Bernardsville, both of N.J.

[73] Assignee: Bell Telephone Laboratories, Incorporated, Murray Hill, N.J.

[22] Filed: May 24, 1973

[21] Appl. No.: 363,401

Related U.S. Application Data

[63] Continuation-in-part of Ser. No. 146,252, May 24, 1971, abandoned.

[52] U.S. Cl. .................. 148/1.5; 148/175; 148/186

[51] Int. Cl.$^{2}$ ........................ H01L 7/54; H01L 7/36

[58] Field of Search ............................. 148/1.5, 175

[56] References Cited

UNITED STATES PATENTS

| | | | |
|---|---|---|---|
| 3,600,241 | 8/1971 | Doo et al. | 148/187 |
| 3,638,300 | 2/1972 | Foxhall et al. | 148/1.5 X |
| 3,655,457 | 4/1972 | Duffy et al. | 148/1.5 |
| 3,745,070 | 7/1973 | Yada et al. | 148/1.5 |

*Primary Examiner*—G. Ozaki
*Attorney, Agent, or Firm*—L. H. Birnbaum

[57] ABSTRACT

A method is described for forming buried layers by ion implantation which includes removal of the damaged region in the semiconductor crystal resulting from such implants. Impurity ions are implanted near the surface of a silicon substrate. The substrate is then heated in an oxidizing ambient for a sufficient length of time to allow the impurities to diffuse further into the crystal while an oxide layer grows on the surface consuming the damaged region. The oxide is removed leaving the impurities in defect-free material upon which may be grown an epitaxial layer.

14 Claims, 4 Drawing Figures

PATENTED JUL 22 1975 3,895,965

INVENTORS A.U. MAC RAE
P. MILLER
R.A. MOLINE
J. SIMPSON

BY [signature]
ATTORNEY

METHOD OF FORMING BURIED LAYERS BY ION IMPLANTATION

CROSS REFERENCE TO RELATED APPLICATION

This application is a continuation-in-part of applicants' copending application, Ser. No. 146,252, filed May 24, 1971, now abandoned.

BACKGROUND OF THE INVENTION

This invention relates to the formation of buried layers in semiconductor devices by means of ion implantation.

Several methods have been suggested for fabricating the high conductance layer used for contacting the collector region of transistor structures. In the conventional diffusion technique, the impurities are diffused into the substrate utilizing an oxide mask to form a region of low resistivity in the crystal. After the oxide is removed, the collector is grown epitaxially on the substrate thus locating the low resistivity region between the collector and substrate. Formation of the base and emitter regions follows. It was discovered, however, that during the diffusion, imperfections are created in the oxide mask which are transferred to the substrate surface. These imperfections then manifest themselves as defects in the epitaxial layer resulting in poor device performance.

In order to overcome this problem, it was proposed that the buried, low resistivity layer be produced by simply implanting the impurity ions into the substrate material, and annealing out any resulting damage to the crystal (see, for example, U.S. Pat. No. 3,457,632). This provides the additional advantage of greater control over the location of the layer than is possible using diffusion techniques. It has been found, however, that implanting impurities such as As at the high dosage required for buried layers typically produces damage to the semiconductor crystal lattice which is so severe as to produce an amorphous region. This region shows residual disorder after subsequent annealing.

It is therefore a primary object of the present invention to form a buried layer by ion implantation while removing the damage caused to the semiconductor crystal by such implants.

SUMMARY OF THE INVENTION

These and other objects are achieved in accordance with the method of the invention which in one embodiment includes implanting As impurities near the surface of a silicon substrate, heating the substrate to diffuse the bulk of the impurities out of the damaged region while growing an oxide on the surface to consume the damaged region, removing the oxide layer, and growing an epitaxial layer over the surface of the substrate.

DESCRIPTION OF THE DRAWING

These and other features of the invention are delineated in detail in the description to follow and in the drawing in which.

DETAILED DESCRIPTION

Figure 1A:
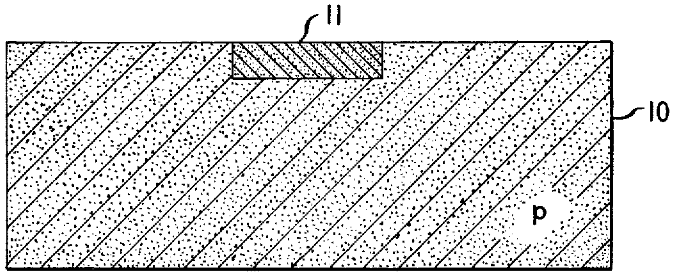
FIGS. 1A through 1D are cross-sectional views of a silicon substrate at successive stages of manufacture according to one embodiment of the invention.

FIGS. 1A–1D demonstrate the formation of the buried region in accordance with the present invention. It should be emphasized that these Figures are not drawn to scale. In FIG. 1A, a silicon substrate, 10, of p-type conductivity is shown after a region of As impurities, 11, has been implanted. The impurity profile is the normal Gaussian distribution with an average depth of approximately 1000A. This depth is reached by accelerating the ions to an energy of about 150 keV. The initial depth of the impurities may vary over a wide range. Care must be taken, however, to implant at a depth which will allow the As atoms to diffuse ahead of the growing oxide film as described below. Thus, the minimum average depth of the implanted region which will produce reasonable yield should be approximately 50A, which requires an ion energy of approximately 5 keV. The exposure of the ion beam was approximately $10^{16}$ ions/cm$^2$. In order to produce an implanted region of sufficiently low resistivity for an ohmic contact, the minimum exposure would be approximately $10^{14}$ ions/cm$^2$. The lateral boundaries of the implanted region were defined by conventional shadow masking techniques.

The high dosage implant described produces damage to the crystal to such an extent as to form an essentially amorphous surface layer in the region of the implant. This layer extends to a depth slightly beyond the range of the implanted impurities (approximately 3000A).

In order to remove this amorphous region, in the typical case the substrate is heated to a temperature of approximately 1200°C. in dry oxygen for about 3½ hours. The heating step diffuses the As impurities further into the substrate crystal and out of the amorphous region. The new average depth of the impurities is approximately 1.5 microns. In the context of this process, the desired ultimate depth is governed by the extent of the amorphous region and to what extent the crystal will be etched prior to epitaxial growth of the collector layer. This ultimate depth may, therefore, typically vary anywhere from 1000A to 20 microns. The temperature may correspondingly vary between 900° and 1400°C. in order to achieve an adequate rate of diffusion without damaging the silicon substrate.

Figure 1B:
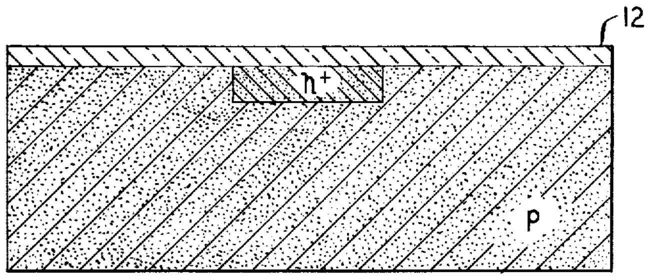

During the diffusion, as shown in FIG. 1B, a layer of silicon dioxide, 12, is grown at the surface of the crystal. The diffusion is conducted for a sufficient length of time so that the oxide layer grows to a depth which is a substantial portion of the depth of the initial amorphous region thus consuming most of the amorphous region. In the embodiment described, the oxide layer consumes approximately 2000A of silicon.

With the limitation on initial depth previously described, the As impurities should diffuse ahead of the growing oxide layer. Diffusion is, in fact, aided as the oxide is formed in accordance with the "snow-plow effect." That is, the oxide layer acts as a moving boundary that limits the diffusion of impurities to the direction away from the surface and, hence, the impurities tend to "snow-plow" in front of the oxide.

Figure 1C:
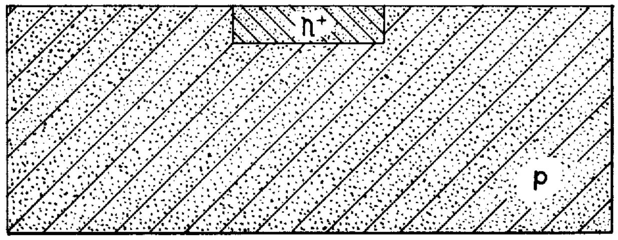

As illustrated in FIG. 1C, the oxide is then removed from the surface. This can be done by any of a variety of means, for example, by applying a solution of hydrofluoric acid. After the oxide is stripped, the impurities are left in material which contains some residual disorder resulting from the initial amorphous region, which disorder is in this example, about 1000A deep. In addition, it has been found that dislocation loops extend beyond the original amorphous region. Therefore, it is desirable, subsequent to stripping the oxide, to etch the surface of the crystal to remove this further damage. Since the surface of the crystal is usually etched anyway before epitaxial growth in order to clean the surface, this process presents no additional steps.

An additional 5000A of crystal is, therefore, removed prior to epitaxial growth by means of a conventional vapor etch, preferably employing HCl. The etch is performed in situ in the epitaxial chamber so that the etched surface will be free of surface contaminants.

It should be clear that the ultimate thickness of the oxide layer depends upon the temperature and length of time of diffusion. The portion of the damaged region which will be consumed can therefore vary. The important criterion is whether the bulk of the impurities will diffuse out of the damaged region during the heating step. Any damage which has not been consumed by the resulting oxide can then be removed by etching.

As an alternative to etching the crystal just prior to epitaxial growth, it is possible to grow an oxide of sufficient thickness so as to consume the entire region of damaged material. This can be done with reasonable yield in a dry oxygen ambient if the impurities are implanted at a sufficiently shallow depth so that an oxide consuming the damaged region can be grown in a reasonable time. For example, the As impurities may be implanted at an average depth in the crystal of 150A using an ion beam with an energy of 15 keV and an exposure of about $4 \times 10^{15}$ ions/cm$^2$. This implant produces damage in the crystal to about a depth of approximately 250A. This entire damaged region may then be removed by, again, heating the substrate at 1200°C. for 3½ hours which grows an oxide consuming about 2000A of silicon, and then stripping off the oxide to leave the bulk of the impurities in defect-free material. If a deeper implant is desired, e.g., 1000A as described above, a sufficiently thick oxide can be grown by a combination of dry and steam oxidation. For example, the substrate can be heated in dry oxygen at a temperature of about 1200°C. for about 1 hour to grow a 2000A thick oxide layer. A steam oxidation can then be done at the same temperature for another hour to grow another 8000A of oxide. Initially heating in dry oxygen insures that the impurities will diffuse far enough into the crystal so that they will not be consumed by the oxide during the subsequent rapid steam oxidation. The oxide can then be removed by a vapor etch in the epitaxial chamber as, for example, by using HF vapor. The advantage of these alternate procedures is the retention of a greater number of impurities in the substrate which would otherwise be lost in the etching step. It should be pointed out that it is feasible to employ a steam oxidation alone if the ions are implanted deep enough in the crystal to diffuse ahead of the oxide. The minimum depth required can be determined by routine experimentation by those skilled in the art.

Figure 1D:
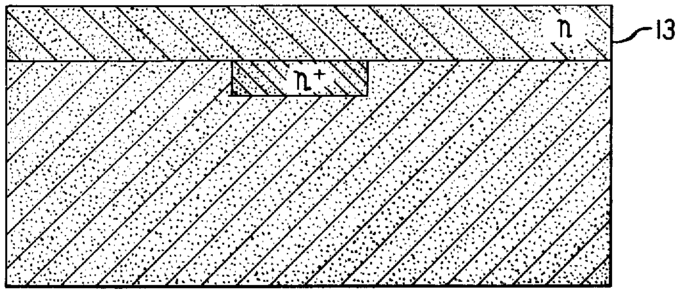

The region of As impurities is then "buried" by growing an epitaxial layer, 13, on the surface of the substrate using conventional techniques such as, in this example, vapor phase epitaxy as illustrated in FIG. 1D. In one application, the epitaxial layer comprises n-type semiconductor material which will be utilized as the collector region in the final transistor structure. The formation of the base and emitter regions then follows according to well-known techniques.

While the invention has been described in terms of an As implantation, it should be clear that other impurities such as P, Sb, and B may be used to form the buried region. The minimum exposure necessary for producing a sufficiently low resistivity region utilizing P and Sb is, again, approximately $10^{14}$ ions/cm$^2$, while the minimum exposure for B is of the order of $10^{15}$ ions/cm$^2$. The other parameters of the process are easily determined by those skilled in the art. As one further illustration, Sb ions may be implanted in the crystal to an average depth of 160A by an ion beam with an energy at approximately 25 keV and an exposure of approximately $4 \times 10^{15}$ ions/cm$^2$. Heating the substrate at approximately 1200°C. for about 3½ hours will again diffuse the bulk of the impurities out of the damaged region while about 2000A of silicon is consumed. The oxide can then be stripped and an epitaxial layer grown on the surface as described above.

Various additional modifications and extensions of this invention will become apparent to those skilled in the art. All such variations and deviations which basically rely on the teachings through which this invention has advanced the art are properly considered within the spirit and scope of the invention.

What is claimed is:

1. A method for forming a silicon device which includes a buried impurity layer comprising the steps of:

implanting impurities into a surface region of a silicon substrate by exposing the surface to a beam containing impurity ions for an exposure of at least $10^{14}$ ions/cm$^2$ and at an accelerating voltage such that the silicon surface is damaged to a depth which is greater than the average depth of ion penetration whereby the major fraction of the implanted ions are in the damaged region;

heating the substrate in an oxidizing ambient for a time and at a temperature sufficient to oxidize the surface of the substrate to a depth greater than the average depth of ion penetration while diffusing the majority of impurities out of the damaged region deeper into the substrate;

removing the oxide layer; and growing an epitaxial layer on the surface of the substrate.

2. The method according to claim 1 wherein the oxidizing ambient comprises dry oxygen.

3. The method according to claim 1 wherein the oxidizing ambient comprises successively dry oxygen and steam.

4. The method according to claim 1 wherein the substrate is heated to a temperature of 900°–1400°C.

5. The method according to claim 1 wherein the substrate is heated in dry oxygen for approximately 1 hour and then in steam for approximately 1 hour at a temperature of approximately 1200°C.

6. The method according to claim 1 wherein the impurities comprise arsenic.

7. The method according to claim 1 wherein the impurities comprise antimony.

8. A method of forming a silicon device which includes a buried impurity layer comprising the steps of:

implanting impurities into a surface region of a silicon substrate by exposing the surface to a beam containing impurity ions for an exposure of at least $10^{14}$ ions/cm$^2$ and at an accelerating voltage such that the silicon surface is damaged to a depth greater than the average depth of ion penetration whereby the major fraction of the implanted ions are in the damaged region;

heating the substrate in an oxidizing ambient for a time and at a temperature sufficient to oxidize the surface of the substrate to a depth greater than the average depth of ion penetration while diffusing the majority of impurities out of the damaged region deeper into the substrate;

removing the oxide layer;

etching the substrate to a sufficient depth to remove the remainder of the damaged region not consumed by said oxide; and growing an epitaxial layer on the surface of the substrate.

9. The method according to claim 8 wherein the oxidizing ambient comprises dry oxygen.

10. The method according to claim 8 wherein the substrate is heated to a temperature of 900°–1400°C.

11. The method according to claim 8 wherein the impurities comprise arsenic.

12. The method according to claim 11 wherein the arsenic ions are accelerated to an energy of at least 5 keV.

13. The method according to claim 11 wherein the substrate is heated to a temperature of approximately 1200°C. for about 3½ hours.

14. The method according to claim 8 wherein the impurities comprise antimony.

* * * * *